United States Patent
Dauelsberg et al.

(10) Patent No.: US 7,625,448 B2
(45) Date of Patent: Dec. 1, 2009

(54) INLET SYSTEM FOR AN MOCVD REACTOR

(75) Inventors: Martin Dauelsberg, Aachen (DE); Martin Conor, Aachen (DE); Gerhard Karl Strauch, Aachen (DE); Johannes Kaeppeler, Wuerselen (DE)

(73) Assignee: Aixtron AG (DE)

(*) Notice: Subject to any disclaimer, the term of this patent is extended or adjusted under 35 U.S.C. 154(b) by 345 days.

(21) Appl. No.: 10/591,906

(22) Filed: Aug. 28, 2006

(65) Prior Publication Data

US 2008/0069953 A1    Mar. 20, 2008

Related U.S. Application Data

(63) Continuation of application No. PCT/EP2005/050765, filed on Feb. 23, 2005.

(30) Foreign Application Priority Data

Feb. 25, 2004 (DE) .................. 10 2004 009 130

(51) Int. Cl.
 *C30B 21/02* (2006.01)
(52) U.S. Cl. .................. 117/94; 117/95; 117/96; 117/101; 117/104; 117/105
(58) Field of Classification Search .................. 117/94, 117/95, 96, 101, 104, 105
 See application file for complete search history.

(56) References Cited

U.S. PATENT DOCUMENTS

| | | | |
|---|---|---|---|
| 4,961,399 A | 10/1990 | Frijlink | 118/730 |
| 6,218,212 B1 * | 4/2001 | Saito et al. | 438/93 |

| | | | |
|---|---|---|---|
| 2003/0177977 A1 | 9/2003 | Strauch et al. | 117/84 |
| 2004/0013801 A1 | 1/2004 | Bremser et al. | 427/255.28 |

FOREIGN PATENT DOCUMENTS

| | | |
|---|---|---|
| DE | 100 43 601 | 3/2002 |
| DE | 100 64 941 | 4/2002 |
| DE | 100 57 134 | 5/2002 |
| DE | 102 47 921 | 4/2004 |
| JP | 42454493 | 9/1992 |

OTHER PUBLICATIONS

International Search Report, Jun. 23, 2005, 5 pages.
International Preliminary Report on Patentability and Written opinion, Oct. 4, 2006, 8 pages.

* cited by examiner

*Primary Examiner*—Robert M Kunemund
(74) *Attorney, Agent, or Firm*—St. Onge Steward Johnston & Reens LLC

(57) ABSTRACT

The invention relates to a device for depositing especially crystalline layers on at least one especially crystalline substrate in a process chamber comprising a top and a vertically opposing heated bottom for receiving the substrates. A gas-admittance body forming vertically superimposed gas-admittance regions is used to separately introduce at least one first and one second gaseous starting material, said starting materials flowing through the process chamber with a carrier gas in the horizontal direction. The gas flow homogenises in an admittance region directly adjacent to the gas-admittance body, and the starting materials are at least partially decomposed, forming decomposition products which are deposited on the substrates in a growth region adjacent to the admittance region, under continuous depletion of the gas flow. An additional gas-admittance region of the gas-admittance body is essential for one of the two starting materials, in order to reduce the horizontal extension of the admittance region.

20 Claims, 1 Drawing Sheet

INLET SYSTEM FOR AN MOCVD REACTOR

CROSS-REFERENCE TO RELATED APPLICATIONS

The present application is a continuation of pending International patent application PCT/EP2005/050765 filed on Feb. 23, 2005 which designates the United States and claims priority from German patent application 10 2004 009 130.7 filed on Feb. 25, 2004, the content of which is incorporated herein by reference.

FIELD OF THE INVENTION

The invention relates to a device for depositing in particular crystalline layers on one or more in particular crystalline substrates in a process chamber, which has a ceiling and a heated floor, vertically opposite the ceiling, for receiving the substrates, with a gas inlet member, which forms gas inlet zones disposed vertically one above the other for introducing at least a first and a second gaseous starting material separately from one another, which starting materials flow in a horizontal direction together with a carrier gas through the process chamber, the stream of gas being homogenized and the starting materials at least partially pre-decomposed in an inlet zone directly adjacent the gas inlet member, the decomposition products of which starting materials are deposited on the substrates in a growing zone adjacent the inlet zone, while the stream of gas is steadily depleted.

The invention additionally relates to a method for depositing in particular crystalline layers on one or more in particular crystalline substrates in a process chamber, which has a ceiling and a heated floor, vertically opposite the ceiling, on which the substrates lie, in which method at least a first and a second gaseous starting material are introduced into the process chamber through gas inlet zones of a gas inlet member disposed vertically one above the other, which starting materials flow in a horizontal direction together with a carrier gas through the process chamber, the stream of gas being homogenized and the starting materials at least partially pre-decomposed in an inlet zone directly adjacent the gas inlet member, the decomposition products of which starting materials are deposited on the substrates in a growing zone adjacent the inlet zone, while the stream of gas is steadily depleted.

BACKGROUND OF THE INVENTION

A device of this type and a method of this type are known from DE 100 43 601 A1. This document describes a circular-symmetrical device for depositing in particular III-V semiconductor layers on III-V semiconductor substrates. The known device has a circular-cylindrical process chamber extending in the horizontal plane. The floor of the process chamber is formed by a heated substrate holder. On the substrate holder there are a multiplicity of substrate carriers in circular arrangement around the center of the holder. One or more substrates may be disposed on each of the substrate carriers. The substrate carriers are rotationally driven. The ceiling of the process chamber, opposite the floor of the process chamber, may likewise be heated. At the center of the ceiling there is a gas inlet member. This protrudes into the process chamber. The portion of the gas inlet member that protrudes into the process chamber is water-cooled. The gas inlet member forms two gas inlet zones, lying vertically one above the other. The inlet zone that is disposed immediately above the floor is located between the floor plate and an end face of the gas inlet member, which has at its center an opening from which a hydride emerges together with a carrier gas. This hydride may be arsine, phosphine or ammonia. Above this inlet zone there is a further inlet zone, through which a gaseous starting material, likewise mixed in a carrier gas, is introduced into the process chamber. This gaseous starting material may be TMGa, TMIn or some other metalorganic compound.

Under typical process conditions, the stream of the first starting material, which flows through the gas inlet zone neighboring the floor of the process chamber, is considerably greater than that which flows through the second gas inlet zone. The starting material which flows through the first gas inlet zone is also of a considerably higher concentration than the starting material which flows through the second gas inlet zone, so that not only is the velocity of the gas flowing through the first gas inlet zone considerably greater than the velocity of the gas flowing through the second gas inlet zone, but the densities of the gases also differ considerably.

In an inlet zone directly adjoining the gas inlet member, the starting materials are partially thermally decomposed. In this zone, a homogenization of the flow or a homogenization of the gas phase also takes place. The two starting materials must mix with each other. In a growing zone adjoining the inlet zone downstream are the substrates. In this zone, the gas phase concentration of the reactants, and in particular of the III component, decreases as the distance from the gas inlet member increases. This gas phase depletion is accompanied by a fall in the growth rate as the distance from the gas inlet member increases. To make the growth more uniform, compensation is provided by the rotation of the substrate carriers. These circumstances are described by DE 100 57 134 A1.

The position of the limit between inlet zone and growing zone is determined by the maximum of the growth rate. This maximum lies where the pre-decomposition or homogenization of the gas phase and of the stream is substantially completed and the growth-limiting group III starting materials are diffused by the dense highly concentrated stream of gas from the lower inlet. The maximum is intended to lie shortly before the beginning of the growing zone in the direction of flow.

If it is wished to increase the capacity of the known device, allowing more substrates to be coated simultaneously, the extent of the growing zone must be increased. At the same time, however, the supply of starting materials must also be increased. If the stream of gas of the starting materials into the process chamber is increased, the limit between inlet zone and growing zone shifts away from the gas inlet member. However, increasing the gas inlet zone in this way is undesired, since undesired adducts can form in this zone. On the other hand, however, the maximum of the growth rate must not lie within the growing zone, in order to ensure homogeneous growth of the layers on the substrates. In addition, increasing the inlet zone entails either a reduction of the growing zone or a structural increase in the size of the entire process chamber. The latter is undesired for reasons of cost.

It is consequently an object of the invention to specify measures as to how the useful surface area in a process chamber can be increased. This increase is at the same time to be possible without reducing the packing density of the substrates on the substrate holder.

SUMMARY OF THE INVENTION

The object is achieved by the invention specified in the claims.

Claim 1 provides first and foremost an additional gas inlet zone of the gas inlet member for one of the two starting materials, to reduce the horizontal extent of the inlet zone.

According to the proposal of claim 2, to reduce the horizontal extent of the inlet zone, one of the two starting materials is to be introduced into the process chamber not just through one gas inlet zone but through two gas inlet zones. The first starting material, which is introduced through a gas inlet zone neighboring the floor of the process chamber, is preferably also introduced through the additional gas inlet zone. This may be neighboring the ceiling of the process chamber. This has the consequence that altogether three gas inlet zones are provided. The V component or the hydride is introduced into the process chamber through the two outer gas inlet zones neighboring the ceiling and the floor. The III component is introduced into the process chamber through the middle gas inlet zone, optionally provided with a pressure barrier. This component is preferably a metalorganic compound, which is dissolved in a carrier gas, for example nitrogen or hydrogen. It is also possible in the case of the device according to the invention or the method according to the invention for the first starting material to be introduced into the process chamber in a concentration that is 100 to 5000 times higher than the second starting material. The device according to the invention may have a heated floor. The ceiling may either be heated or not heated. Preferably, however, it is a hot-wall reactor with a heated floor and a non-heated ceiling. Furthermore, it is possible for the vertical size of the gas inlet zones neighboring the floor and the ceiling to be less than the vertical size of the middle gas inlet zone. The sum of the two sizes of the gas inlet zones neighboring the floor and the ceiling may also be less than the size of the middle gas inlet zone. The gas may flow in through the outer gas inlet zones at a higher flow velocity than through the middle gas inlet zone. The reactor may have a rotationally driven substrate holder, as described by DE 100 43 601 A1. The substrate holder may in the same way have substrate carriers disposed around the center of the substrate holder in the manner of satellites. Altogether, there may be six substrate carriers, which surround the circular inlet zone lying close together in a circular arrangement. The growing zone then has an annular shape. Each individual substrate carrier may carry a total of seven substrates. This achieves a high packing density. In a way similar to in the prior art, the gas inlet member may be water-cooled, so that abrupt heating of the process gas takes place when it flows into the process chamber. The inlet member is designed in such a way that each of the three or more inlet zones can be individually supplied with gas. Corresponding mass flow regulators and valves are provided for this purpose. In particular, the middle gas inlet zone, which is associated with the metalorganic component, may have a pressure barrier. This pressure barrier may consist of a porous material. This avoids back diffusion. The gas inlet member may, in a known manner, have a rotationally symmetrical shape, as described for example in DE 100 64 941 A1. The substrate holder is heated. It is heated by means of radiation and/or heat conduction. The heat for heating the floor may be generated as infrared heat. Electrical resistance heating is also possible.

BRIEF DESCRIPTION OF THE DRAWINGS

An exemplary embodiment of the invention is explained below with reference to accompanying drawings, in which.

DETAILED DESCRIPTION OF THE INVENTION

Figure 1:
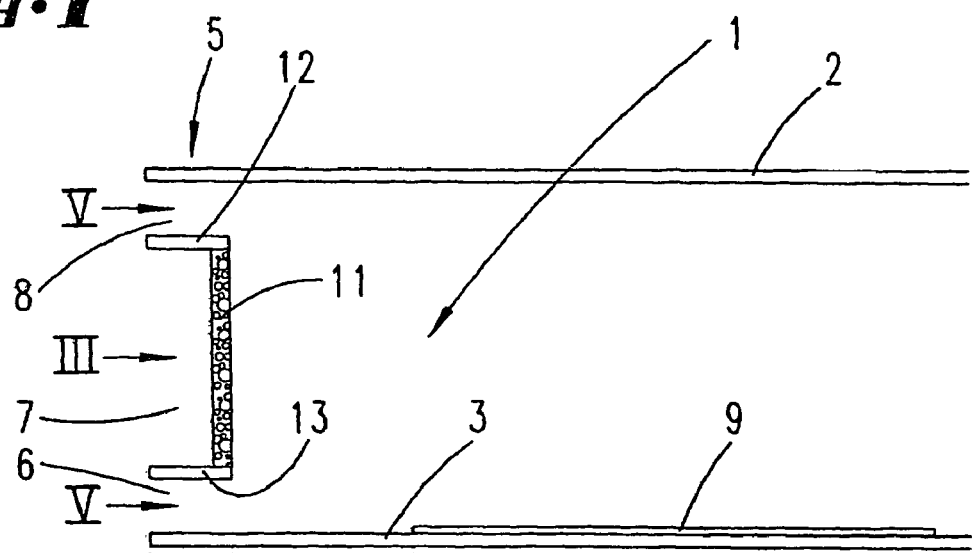
FIG. 1 shows the cross section through one half of a rotationally symmetrical reactor in a broadly schematic representation.

The exemplary embodiment shows a rotationally symmetrical reactor, in which the gases are introduced at the center and in which the gases are carried away in the region of the periphery. However, the invention also relates to those reactors which have the form of a tube, in which the gas is introduced at one end and the gas is discharged at the other end.

A significant component is a gas inlet member 5. This is located where the gas is introduced into the process chamber, that is to say at the center in the case of a process chamber 1 of a circular-symmetrical shape. The gas inlet member 5 has three gas inlet zones 6, 7, 8, disposed vertically one above the other. The three gas inlet zones are located between the ceiling 2 and the floor 3 of the process chamber 1.

In the exemplary embodiment, the floor 3 is actively heated by suitable means. The ceiling 2 is indirectly heated by the heated floor 3 by means of radiation and heat conduction. The heat for heating the floor 3 may be generated as infrared heat. However, it is also envisaged to generate the heat in the manner described by DE 100 43 601 A1, that is by high frequency.

In the case of the exemplary embodiment, the process gas flows through the process chamber 1 from the center to the periphery. For depositing III-V semiconductors, the V components are fed in as hydrides through the gas inlet zones 6, 8, which are directly neighboring the ceiling 2 and the floor 3, respectively. In particular, $PH_3$, $AsH_3$ or $NH_3$ is introduced through the gas inlet zones 6 and 8.

The metalorganic III component is introduced through the middle gas inlet zone 7, disposed between the outer gas inlet zones 6 and 8; in particular, TMG or TMI or an Al compound is introduced here.

An annular pressure barrier of a porous, gas-permeable material is designated by the reference numeral 11. The III component flows through this together with the carrier gas. The gas which passes through the outer gas inlet zones 6 and 8 is of a greater density and mass flow than the gas which flows into the process chamber 1 through the middle gas inlet zone 7. The gas inflows in the gas inlet zones 6, 8 can be set independently of the gas flow in the gas inlet zone 7.

Cross-pieces or separating elements by which the gases entering the process chamber through the gas inlet zones 6, 7, 8 are separated are designated by the reference numerals 12 and 13. Here, the representation is only schematic. It goes without saying that such gas conducting means as pipes or ducts that are capable of conducting the gases flowing through the gas inlet zones 6, 7, 8 separately from one another from a gas supply device to the reactor are provided.

Figure 2:
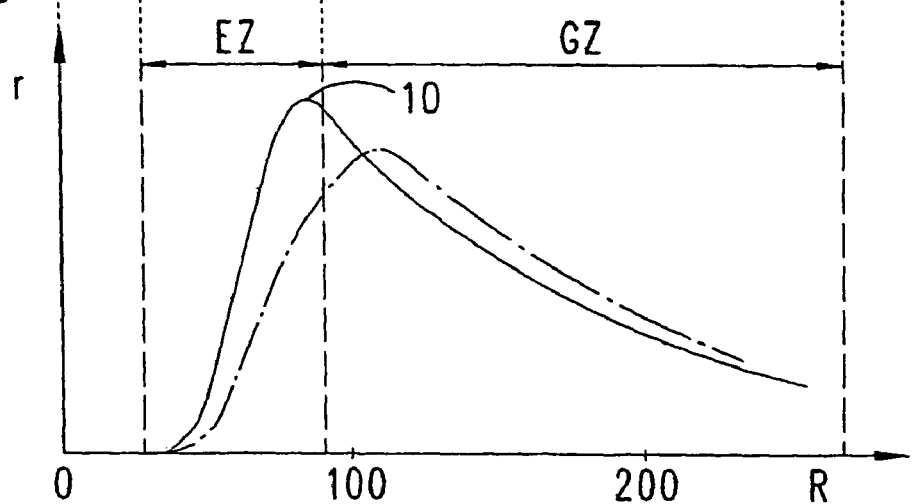
FIG. 2 shows the radial variation in the growth rate.

In FIG. 2, the inlet zone is designated by EZ. Within this inlet zone, the reactive components entering the process chamber from the gas inlet zones 6 and 8 or 7 are mixed. This substantially takes place by diffusion. Adequate mixing is achieved by the limit of the inlet zone that is represented in FIG. 2 as a dashed line. By this limit, the flow profile in the process chamber has also been homogenized. The pyrolytically decomposable components, and in particular the hydride, which is decomposable with more difficulty and flows into the process chamber 1 through the gas inlet zones 6 and 8, have likewise been partially pyrolytically decomposed by this limit. However, the radial width of the inlet zone EZ is so small that adduct formation between the components is prevented to a sufficient extent.

The solid curve in FIG. 2 characterizes the growth rate in dependence on the radial distance from the center of the process chamber 1. The maximum 10 of the growth rate r lies shortly before the limit of the inlet zone EZ. In the region of the growing zone GZ adjoining the inlet zone EZ in the radially outward direction, the growth rate r falls as the radial distance R increases. This fall in the growth rate is compensated by the rotation about their own axis of the circular disk-shaped substrate carriers 9 represented in FIG. 3. The substrate carriers 9 may in this case be mounted on a gas cushion and—as described in DE 100 43 601 A1—be rotationally driven by means of gas jets. Also serving to make the layer thickness more uniform over the substrates 4 is the rotation of the entire substrate holder 3, which is formed by the floor of the process chamber 1, about the axis of the process chamber.

Figure 3:
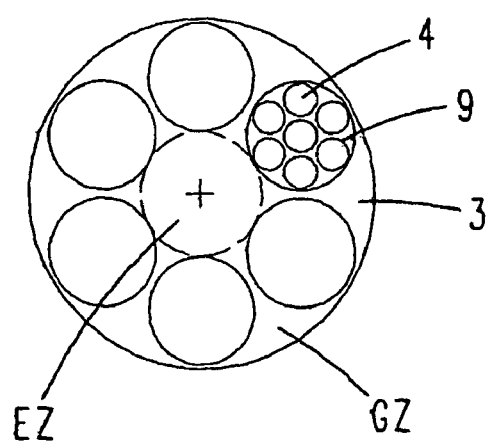
FIG. 3 shows the plan view of a substrate holder with altogether six substrate carriers, which are in each case loaded with seven substrates.

As can be gathered from FIG. 3, the individual substrate carriers 9 have a diameter which is great enough to accommodate seven 2" substrates in extremely closely packed formation. Altogether, six substrate carriers are disposed around the center of the substrate holder 3 in a uniformly distributed manner.

The curve represented by a dashed-dotted line in FIG. 2 shows the variation in the growth rate r with respect to the radial distance R from the center of the process chamber 1 as it is in the prior art, in which a gas inlet member such as that described in DE 100 43 601 A1 is used. The additional gas inlet zone 8 for the V component has the effect that the maximum of the growth rate r shifts toward a smaller radial distance R.

It is provided that the vertical sizes of the gas inlet zones 6 and 8 are each of the same size. The same amounts of gas per unit of time are also preferably intended to flow through these gas inlet zones 6 and 8. The sizes of the gas inlet zones 6, 8 are less than the size of the middle gas inlet zone 7. In particular, the sum of the sizes of the gas inlet zones 6 and 8 is less than the size of the middle inlet zone 7.

Model calculations in the case of a device of the prior art (DE 100 43 601 A1) have shown that the different densities and the great differences in the flow velocities of the gases entering the process chamber through the gas inlet zones produce an annular vortex underneath the ceiling in the region of the inlet zone EZ. It has been observed that a stream of gas with a gas which flows through an additional gas inlet zone 8 adjacent the ceiling 2 prevents this vortex. A flow profile that is symmetrical with respect to the horizontal center plane of the process chamber 1 is created in the region of the inlet zone EZ, homogenized into a parabolic flow profile up to the limit represented by the dashed line.

The ratios of the sizes of gas inlet zone 6, gas inlet zone 7 and gas inlet zone 8 in relation to one another is preferably 4:15:4.

All disclosed features are (in themselves) pertinent to the invention. The disclosure content of the associated/accompanying priority documents (copy of the prior application) is also hereby incorporated in full in the disclosure of the application, including for the purpose of incorporating features of these documents in claims of the present application.

What is claimed is:

1. A device for depositing crystalline layers on one or more substrates in a process chamber, said process chamber comprising a ceiling and a heated floor that is vertically opposite the ceiling and receives the substrates, said device comprising:
   a gas inlet member disposed at substantially the center of the process chamber, which forms gas inlet zones disposed vertically one above the other for introducing at least a first and a second gaseous starting material separately from one another;
   a bottom gas inlet zone neighboring the floor of the process chamber for introducing a first starting material into the process chamber;
   a top gas inlet zone neighboring the ceiling of the process chamber also for introducing the first starting material into the process chamber;
   a middle gas inlet zone between the top gas inlet zone and bottom gas inlet zone for introducing the second starting material into the process chamber;
   a single supply of a hydride connected to both the bottom and the top gas inlet zones, the hydride being the first starting material;
   a supply of a metalorganic compound connected to the middle gas inlet zone, the metalorganic compound being the second starting material;
   at least one substrate carrier arranged around the gas inlet member, being rotationally driven around its axis and carrying the one or more substrates; and
   wherein the starting materials flow in a horizontal direction together with a carrier gas through the process chamber, the stream of gas being homogenized and the starting materials at least partially pre-decomposed in an inlet zone directly adjacent the gas inlet member, the decomposition products of which starting materials are deposited on the substrates in a growing zone adjacent the inlet zone, while the stream of gas is steadily depleted.

2. A method for depositing crystalline layers on one or more substrates in a process chamber, said process chamber comprising a ceiling and a heated floor which is vertically opposite the ceiling and on which the substrates lie, said method comprising the steps of:
   positioning a gas inlet member at substantially the center of the process chamber for introducing at least a first and a second gaseous starting material into the process chamber through gas inlet zones disposed vertically one above the other on the gas inlet member;
   arranging one or more substrates in a rotationally symmetric manner around said gas inlet member;
   rotating each substrate;
   introducing said first gaseous starting material through a bottom gas inlet zone neighboring the floor of the process chamber and a top gas inlet zone neighboring the ceiling of the process chamber, wherein the first starting material is a hydride, and wherein said first gaseous starting material is introduced through both the bottom gas inlet zone and the top gas inlet zone from a single supply;
   introducing said second gaseous starting material through a middle gas inlet zone between the bottom gas inlet zone and the top gas inlet zone, wherein the second starting material is a metalorganic compound; and
   wherein the starting materials flow in a horizontal direction together with a carrier gas through the process chamber, the stream of gas being homogenized and the starting materials at least partially pre-decomposed in an inlet zone directly adjacent the gas inlet member, the decomposition products of which starting materials are deposited on the substrates in a growing zone adjacent the inlet zone, while the stream of gas is steadily depleted; and
   wherein the steps of introducing the starting materials are performed in order to reduce the horizontal extent of the inlet zone.

3. The device according to claim 1, characterized in that the first starting material is $AsH_3$, $PH_3$ or an $NH_3$.

4. The device according to claim 1, characterized in that the decomposition product of the first starting material is an element of the group V or VI and the decomposition product of the second starting material is an element of the group III or II.

5. The device according to claim 1, characterized in that at least one of the first and the second starting material is respectively introduced into the process chamber by means of a carrier gas through the gas inlet zone associated with it.

6. The device according to claim 1, characterized in that the first starting material is introduced into the process chamber in a concentration that is 100 to 5000 or 1000 to 5000 times higher than the second starting material.

7. The device according to claim 1, characterized in that the vertical size of the bottom gas inlet zone or the top gas inlet zone is less than the vertical size of the middle gas inlet zone.

8. The device according to claim 7, characterized in that the sum of the two sizes of the bottom and top gas inlet zones is less than the size of the middle gas inlet zone.

9. The device according to claim 1, characterized in that the floor of the process chamber forming a substrate holder is heated from below.

10. The device according to claim 1, characterized in that the process chamber has an axial symmetry.

11. The device according to claim 10, characterized in that the substrate holder is rotationally driven about the center of the process chamber.

12. The device according to claim 10, wherein a multiplicity of circular disk-shaped substrate carriers are disposed next to one another in the circumferential direction on the substrate holder and carry one or more substrates.

13. The device according to claim 12, characterized in that each substrate carrier carries seven circular substrates and altogether six or more substrate carriers are associated with the substrate holder, located close to one another in uniform circumferential distribution.

14. The device according to claim 1, characterized in that the zone of the maximum growth rate lies radially within the annular growing zone in the marginal region of the inlet zones.

15. The device according to claim 14, characterized in that the diameter of the inlet zone is less than the radial extent of the growing zone.

16. The method according to claim 2, characterized in that the first starting material is one of $AsH_3$, $PH_3$ and $NH_3$.

17. The method according to claim 2, wherein at least one of the first and the second starting material is respectively introduced into the process chamber by means of a carrier gas through the gas inlet zone associated with it.

18. The method according to claim 2, wherein the vertical size of the bottom gas inlet zone or the top gas inlet zone is less than the vertical size of the middle gas inlet zone.

19. The method according to claim 2, wherein the floor of the process chamber forming a substrate holder is heated from below.

20. The method according to claim 2, characterized in that the process chamber has an axial symmetry.

* * * * *